(12) United States Patent
Sardesai et al.

(10) Patent No.: US 10,043,708 B2
(45) Date of Patent: Aug. 7, 2018

(54) STRUCTURE AND METHOD FOR CAPPING COBALT CONTACTS

(71) Applicant: GLOBALFOUNDRIES INC., Grand Cayman (KY)

(72) Inventors: Viraj Sardesai, Malta, NY (US); Suraj K. Patil, Ballston Lake, NY (US); Scott Beasor, Greenwich, NY (US); Vimal Kumar Kamineni, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/347,119

(22) Filed: Nov. 9, 2016

(65) Prior Publication Data

US 2018/0130703 A1 May 10, 2018

(51) Int. Cl.
*H01L 29/40* (2006.01)
*H01L 21/768* (2006.01)
*H01L 23/522* (2006.01)
*H01L 23/532* (2006.01)

(52) U.S. Cl.
CPC .. *H01L 21/76849* (2013.01); *H01L 21/76802* (2013.01); *H01L 21/76843* (2013.01); *H01L 21/76877* (2013.01); *H01L 21/76886* (2013.01); *H01L 23/5226* (2013.01); *H01L 23/53209* (2013.01)

(58) Field of Classification Search
CPC ......... H01L 21/76849; H01L 21/76802; H01L 21/76843
See application file for complete search history.

(56) References Cited

U.S. PATENT DOCUMENTS

| 2007/0018329 | A1* | 1/2007 | Oh ................... H01L 21/76832 257/762 |
| 2007/0111522 | A1* | 5/2007 | Lim ................... H01L 21/2855 438/682 |
| 2014/0183738 | A1* | 7/2014 | Jezewski ............... H01L 23/485 257/751 |

* cited by examiner

*Primary Examiner* — Marc Armand
*Assistant Examiner* — Sarah Salerno
(74) *Attorney, Agent, or Firm* — Scully, Scott, Murphy & Presser PC

(57) ABSTRACT

A process for forming a conductive structure includes the formation of a self-aligned silicide cap over a cobalt-based contact. The silicide cap is formed in situ by the deposition of a thin silicon layer over exposed portions of a cobalt contact, followed by heat treatment to react the deposited silicon with the cobalt and form cobalt silicide, which is an effective barrier to cobalt migration and oxidation.

14 Claims, 3 Drawing Sheets

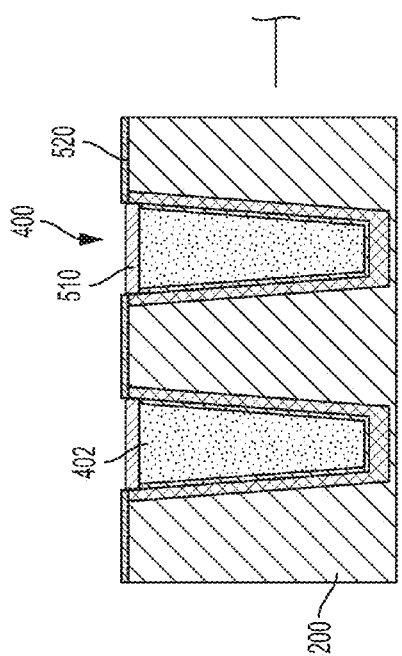
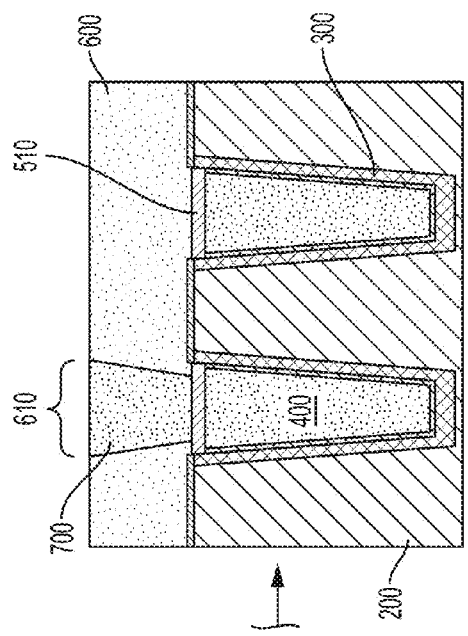
FIG. 5A
FIG. 5B
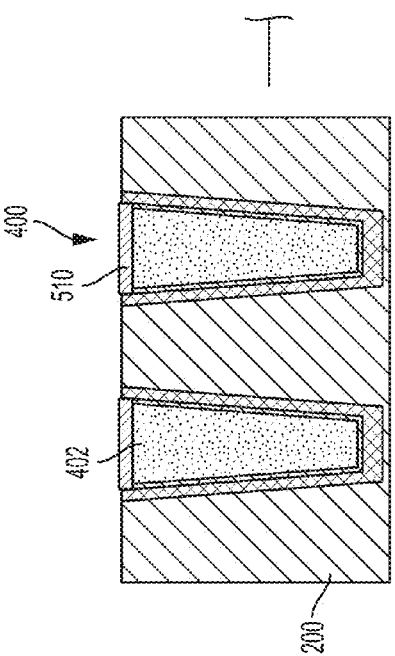
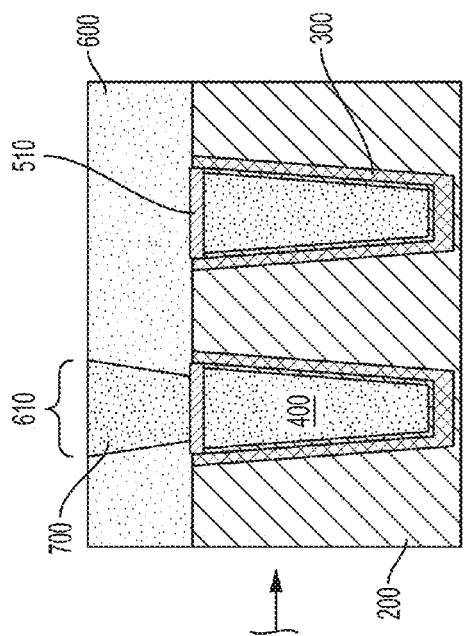
FIG. 6A
FIG. 6B

US 10,043,708 B2

STRUCTURE AND METHOD FOR CAPPING COBALT CONTACTS

BACKGROUND

The present application relates generally to conductive interconnect structures, and more specifically to cobalt-based interconnect structures and capping layers that inhibit the oxidation and migration of cobalt.

Electrically-conductive connections between integrated circuit (IC) devices formed in a semiconductor substrate are traditionally made using multi-layer interconnects. Each interconnect layer can be supported over the substrate by an interlayer dielectric. Furthermore, electrical connections to and between different conductive layers are commonly made using contacts in the form of plugs that traverse one or more layers of the interlayer dielectric.

Typical interconnect structures comprise copper (Cu) or tungsten (W). Copper is advantageous because of its low electrical resistivity. However, copper is susceptible to electromigration and void formation, which can lead to device failure, while the precursors used during tungsten CVD processes are highly reactive with silicon and liner materials. Thus, tungsten is particularly sensitive to defects (e.g., pin-hole defects) in the barrier layer architecture used to isolate the tungsten interconnects from the liner metal and silicon. In addition, tungsten resistance cannot be decreased with post-deposition annealing as it is a refractory metal and does not undergo recrystallization or grain growth at thermal budgets that are compatible with semiconductor manufacturing. Moreover, the barrier and nucleation layer thicknesses for tungsten-based metallization are not scaling to meet resistance requirements at advanced nodes.

An alternative interconnect material to copper and tungsten is cobalt. Due to a higher activation energy, cobalt is less prone to electromigration compared to copper, and is compatible with thin barrier layer architectures, which can be especially advantageous at advanced nodes, e.g., less than 14 nm. Processing subsequent to the formation of cobalt contacts, however, including the deposition of an overlying interlayer dielectric, can induce unwanted oxidation, diffusion and/or migration of cobalt. Cobalt oxidation can undesirably increase contact resistance. Migration of cobalt can lead to electrical shorts between adjacent structures, which can adversely affect device performance and reliability.

Various approaches to capping cobalt contacts, including the capping of cobalt contacts with dielectric materials such as silicon oxynitride, have been shown to be ineffective at inhibiting cobalt migration. For instance, FIG. 1A is a cross-sectional micrograph showing a plurality of comparative cobalt contacts 40 embedded within an interlayer dielectric 20 with a dielectric capping layer 50 formed over the contacts 40. FIG. 1B is an elemental line scan across the highlighted region of FIG. 1A showing the undesired migration of cobalt to regions of the structure between adjacent contacts following formation of a dielectric capping layer over the interlayer dielectric layer.

SUMMARY

In view of the foregoing, it would be advantageous to develop methods and structures for efficiently and effectively capping cobalt-based contacts. In accordance with embodiments of the present application, a process for forming cobalt-based contacts includes the formation of a self-aligned silicide cap over cobalt-based contacts that are disposed within an interlayer dielectric. The silicide cap is formed in situ by the deposition of a thin silicon layer over exposed portions of a cobalt contact, followed by heat treatment to react the deposited silicon with the cobalt and form a cobalt silicide. The cobalt silicide is an effective barrier to cobalt migration and oxidation.

Formation of the silicon layer may comprise a blanket deposition step, where silicon is deposited over the exposed top surface of the cobalt contact as well as over a top surface of the interlayer dielectric. Silicon deposition can be performed at a relatively low temperature. In various embodiments, following silicon deposition, a low temperature annealing step is used to form the capping silicide. Unreacted (i.e., un-silicided) portions of the silicon layer can be removed or, according to alternate embodiments, nitrided to form a silicon nitride layer disposed over the interlayer dielectric and adjacent to the silicide capping layer.

According to various embodiments, a method for forming a conductive structure comprises forming a conductive cobalt contact within a dielectric layer, forming a silicon layer directly over a surface of the contact, and reacting the silicon layer with the cobalt to form a cobalt silicide layer directly over the contact.

In further embodiments, a semiconductor structure comprises a dielectric layer disposed over a semiconductor substrate, a cobalt-containing contact extending through the dielectric layer, and a cobalt silicide capping layer disposed directly over the cobalt-containing contact.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 5A shows capping layers of cobalt silicide over cobalt contacts and a layer of silicon nitride adjacent to the capping layers and over the dielectric layer according to certain embodiments;

FIG. 5B depicts the formation of an interlayer dielectric over the structure of FIG. 5A;

FIG. 6A shows capping layers of cobalt silicide over cobalt contacts following the removal of unreacted silicon from over the dielectric layer laterally adjacent to the cobalt contacts; and FIG. 6B depicts the formation of an interlayer dielectric over the structure of FIG. 6A.

DETAILED DESCRIPTION

Figure 1A:
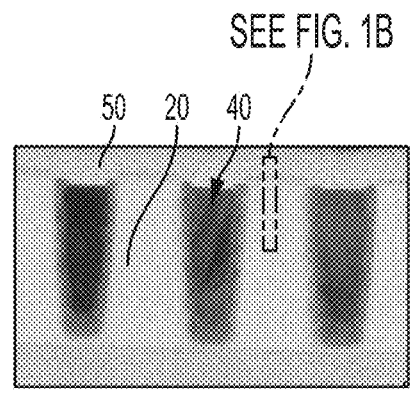
FIG. 1A is a cross-sectional micrograph showing a plurality of comparative cobalt contacts with a dielectric capping layer disposed over the contacts.
Figure 1B:
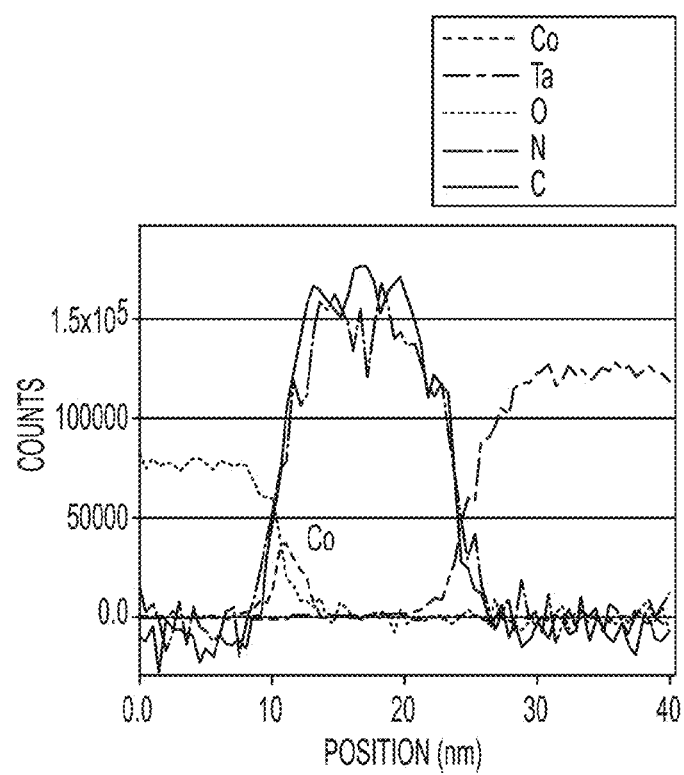
FIG. 1B is an elemental line scan showing the migration of cobalt to regions of the structure of FIG. 1A between adjacent contacts.

Reference will now be made in greater detail to various embodiments of the subject matter of the present application, some embodiments of which are illustrated in the accompanying drawings. The same reference numerals will be used throughout the drawings to refer to the same or similar parts.

Figure 2:
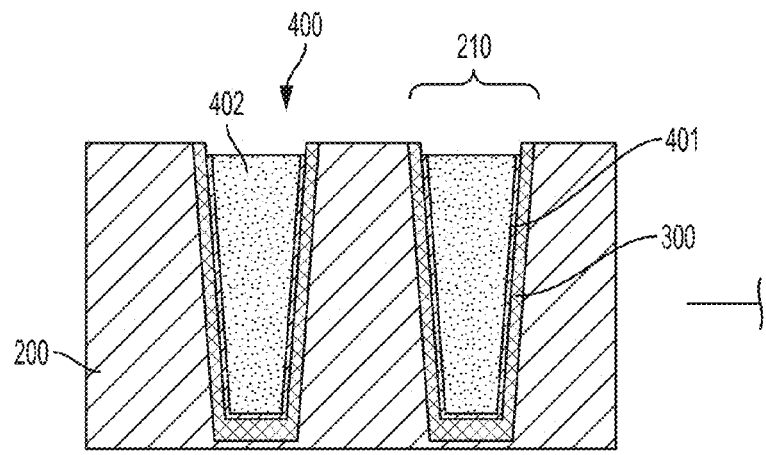
FIG. 2 is a cross-sectional schematic showing a post-planarization architecture with cobalt contacts embedded with a dielectric layer.

Referring to FIG. 2, a dielectric layer 200 is disposed over a semiconductor substrate (not shown). The semiconductor substrate may comprise a bulk semiconductor substrate or a hybrid substrate such as a semiconductor-on-insulator (SOI) substrate, and may include active and passive devices, such as transistors, capacitors, resistors, etc. Dielectric layer 200 may comprise any suitable insulating or dielectric material including oxides, nitrides and oxynitrides, such as silicon dioxide, silicon nitride, silicon oxynitride, SiOC, SiOCN and SiBCN, as well as other low dielectric constant (low-k) materials. As used herein, a "low-k" material has a dielectric constant less than that of silicon dioxide.

Exemplary low-k materials include, but are not limited to, amorphous carbon, fluorine-doped oxides, and carbon-doped oxides. Commercially-available low-k dielectric products and materials include Dow Corning's SiLK™ and porous SiLK™, Applied Materials' Black Diamond™, Texas Instrument's Coral™ and TSMC's Black Diamond™ and Coral™.

Although only a single dielectric layer 200 is shown, it will be appreciated that dielectric layer 200 may comprise multiple dielectric layers of the same or different composition.

A via 210 is formed in the dielectric layer 200 to expose a conductive layer or region (not shown) within or on the substrate. Via 210 may be formed using patterning and etching processes known to those skilled in the art. The patterning process may comprise photolithography, for example, which includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material is thereafter transferred into the underlying dielectric layer or dielectric layers utilizing at least one pattern transfer etching process.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

A conductive structure such as a cobalt contact 400 is then formed within via 210. Prior to forming the cobalt contact 400, a liner/barrier layer 300 may be formed within via 210. For instance, the liner/barrier layer 300 may comprise one or more layers of tantalum, tantalum nitride, titanium or titanium nitride. In various embodiments, the liner/barrier layer 300 comprises a line-of-sight deposited (PVD) or conformal (ALD/CVD) layer of titanium (Ti) formed over exposed surfaces of the dielectric layer(s) and silicon within via 210, and a conformal layer of titanium nitride (TiN) formed over the layer of titanium. The liner/barrier layer 300 may also be formed over a top surface of the dielectric layer 200. In various embodiments, the liner/barrier layer 300 prevents cobalt from diffusing into dielectric layer 200. The thickness of the one or more layers that form the liner/barrier layer 300 may independently range from 2 nm to 10 nm, e.g., 2, 4, 6, 8 or 10 nm, including ranges between any of the foregoing values.

In various embodiments, a cobalt seed layer 401 is deposited on the sidewalls and the bottom surface of the via 210, e.g., directly on liner/barrier layer 300. Cobalt seed layer 401 may be a conformal layer having a thickness of 1 to 5 nm, e.g., 1, 2, 3, 4, or 5 nm, including ranges between any of the foregoing values. Seed layer 401 may be formed using chemical vapor deposition (CVD), physical vapor deposition (PVD), atomic layer deposition (ALD), electroplating, electroless plating or other suitable process for creating a conformal thin film. Cobalt seed layer 401 may comprise cobalt and, as will be appreciated by those skilled in the art, may be adapted to serve as a nucleation layer for the deposition of a fill material used to fill via 210.

A fill material 402 may be deposited on exposed surfaces of the seed layer 401 to form a cobalt contact 400 that substantially fills via 210. The fill material 402 may be deposited by CVD, PVD, ALD, electroplating, or electroless plating, for example.

As used herein, a cobalt contact 400 comprises cobalt, and may include elemental cobalt as well as alloys and mixtures that contain cobalt. The fill material 402 may comprise cobalt metal or a cobalt alloy. In certain embodiments, the fill material 402 and the seed layer 401 have the same composition. In alternate embodiments, the fill material 402 and the seed layer 401 have different compositions. By way of example, the composition of the seed layer 401 and the composition of fill material 402 may be independently chosen from elemental cobalt (Co) and cobalt alloyed with up to 50 atomic percent of one or more of B, C, N, Mg, Al, Si, P, Ti, V, Cr, Mn, Fe, Ni, Cu, Zn, Ge, Zr, Nb, Mo, Ru, Rh, Pd, Ag, Hf, Ta, W, Re, Ir, Pt and Au.

Thus, illustrated in FIG. 2 is an intermediate, post-planarization device architecture comprising a cobalt contact 400 disposed within dielectric layer 200. As will be appreciated by those skilled in the art, a planarization process can be used to remove the overburden, i.e., portions of the liner/barrier layer 300, seed layer 401, and fill material 402 deposited outside of via 210, i.e., over a top surface of the dielectric layer 200, to form a global planarized surface. A top surface of dielectric layer 200 may serve as a stopping layer. In certain embodiments, a surface of the cobalt contact 400 is substantially co-planar with a surface of the dielectric layer 200. In certain embodiments, a surface of the cobalt contact 400 is recessed below a surface of the dielectric layer 200.

"Planarization" refers to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Figure 3:
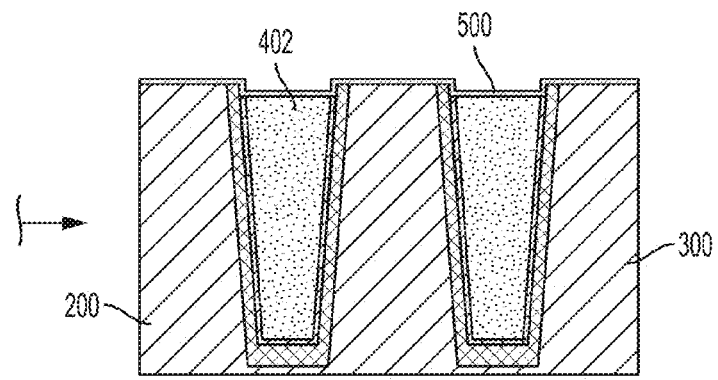
FIG. 3 illustrates the formation of a conformal layer of silicon over the structure of FIG. 2.

Referring to FIG. 3, a thin silicon layer 500 is formed over the architecture of FIG. 2. In the illustrated embodiment, the silicon layer is deposited directly over exposed portions of fill material 402, i.e., directly over cobalt contact 400. The silicon layer 500 is deposited over the cobalt contact at a thickness sufficient to provide a satisfactory thickness of the resulting cobalt silicide. In various embodiments, the thickness of silicon layer 500 can range from 2 to 10 nm, e.g., 2, 4, 6, 8, or 10 nm, including ranges between any of the foregoing values.

The silicon layer can comprise elemental silicon (Si) or silicon alloys, including silicon doped with one or more dopants, i.e., impurities. Example dopants that may be incorporated into the silicon layer 500 include boron, carbon, nitrogen, aluminum, phosphorus, gallium, arsenic, indium and antimony. The dopant content within the silicon layer 500 may range from 0 to 5 atomic percent, i.e., 0, 1, 2, 3, 4 or 5 atomic percent, including ranges between any of the foregoing values.

Various methods can be used to form silicon layer 500, including physical vapor deposition (PVD), plasma doping, and gas cluster ion beam (GCIB) technology, although other deposition methods such as chemical vapor deposition (CVD) are contemplated. According to certain embodiments, the deposition temperature (i.e., substrate temperature) during formation of silicon layer 500 is less than 275° C., e.g., 25, 50, 100, 150, 200, 250 or 275° C., including ranges between any of the foregoing values. The as-deposited silicon layer 500 may be crystalline, e.g., polycrystalline, amorphous, or a mixture of crystalline and amorphous materials.

A physical vapor deposition (PVD) method to form silicon layer 500 includes selecting a target material comprising silicon, introducing a sputtering gas to a reaction chamber comprising the semiconductor substrate and the target material, and forming a plasma in an atmosphere of the sputtering gas to sputter atoms from the target material to the semiconductor substrate to form a silicon layer 500 on the substrate. i.e., over the cobalt contact and optionally over exposed surfaces of the dielectric layer 200. The sputtering gas can comprise one or more of helium, nitrogen and argon.

In further embodiments, silicon layer 500 may be formed using a gas-cluster ion beam (GCIB) process. Gas clusters are nanoscale gaseous aggregates at standard temperature and pressure. Gas clusters can be ionized by electron bombardment, which enables the gas clusters to be formed into directed beams of energy, which can be aim at a workpiece and deposited as a thin film.

Subsequent to the formation of silicon layer 500, embodiments of the present application include an annealing step to promote reaction of silicon with cobalt to form a silicide of cobalt. Such annealing can be performed at a temperature of 200° C. to 450° C., e.g., 300° C. to react the silicon layer 500 with the cobalt contact 400 to form a thin, well-adhered silicide capping layer 510 directly over the cobalt contact 400. The cobalt silicide capping layer 510 may be amorphous, crystalline or a mixture of amorphous and crystalline phases.

The annealing step may be carried out using a conventional oven or using rapid thermal annealing (RTA) for a period of time ranging from 5 seconds to 10 min, for example, e.g., 10 to 60 seconds. In various embodiments, a majority of the silicon layer 500 overlying the cobalt contact 400 is converted to a silicide capping layer 510. For instance, 70-100% of the silicon layer 500 disposed over the cobalt contact may be reacted to form a cobalt silicide. In such embodiments 70, 80, 90 or 100% of the silicon, including ranges between any of the foregoing values, is reacted to form a silicide. In particular embodiments, all of the silicon disposed over the cobalt contacts 400 reacts to form a silicide.

The silicidation anneal can be carried out in an inert atmosphere. In certain embodiments, the anneal is performed in an oxygen-free or substantially oxygen-free atmosphere. As used herein, "substantially oxygen-free" means less than 100 ppm oxygen, such as 5, 10, 20 or 50 ppm oxygen, including ranges between any of the foregoing values.

Figure 4:
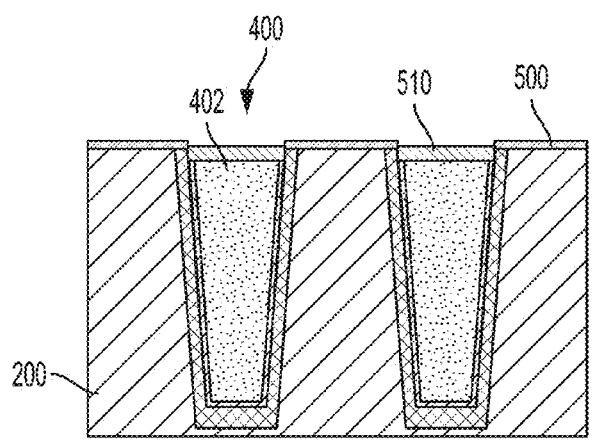
FIG. 4 shows capping layers of cobalt silicide formed over cobalt contacts according to various embodiments.

Referring to FIG. 4, a top surface of the silicide capping layer 510 can be co-planar with a top surface of dielectric layer 200. According to alternate embodiments, a top surface of the silicide capping layer 510 can be above or below a top surface of dielectric layer 200. In the illustrated embodiment, unreacted portions of silicon layer 500 are disposed over the dielectric layer 200 adjacent to the silicide capping layers 510.

In various embodiments, referring to FIG. 5A, the unreacted portions of the silicon layer 500 can be nitrided to form a silicon nitride layer 520. Silicon nitride layer 520 can be formed, for example, by GCIB or direct nitridation. For example, nitridation of the silicon layer 500 proceeds at a suitable temperature by exposure to an atmosphere comprising nitrogen gas or ammonia.

Referring to FIG. 5B, after forming the silicide capping layer 510 and silicon nitride layer 520, a second dielectric layer 600 can be formed over the capping layer 510 and the nitride layer 520. Contact vias 610 can be formed in the second dielectric layer 600 using the patterning and etching processes as described above in conjunction with vias 210, and contacts 700 can be formed in the contact vias 610 using, for example, chemical vapor deposition, physical vapor deposition, electroplating or electroless plating. In various embodiments, contacts 700 extend through second dielectric layer 600 and are in electrical contact with silicide capping layer 510. Contacts 700 may comprise any suitable conductive material.

The etch chemistry used to form contact vias 610 in dielectric layer 600 to expose a top surface of the silicide capping layer 510 may etch the silicide capping layer 510 at a different etch rate than cobalt. Etch selectivity of the cobalt silicide relative to cobalt can minimize gouging of the cobalt contact 400 during patterning and etching of the overlying interlayer dielectric 600. In various embodiments, the etch step used to define contact vias 610 removes less than 50% of a thickness of the silicide capping layer at the bottom of the contact vias 610, e.g., 5, 10, 20, 30 or 40%, including ranges between any of the foregoing values.

Referring to FIG. 6A, as an alternative to nitriding the silicon layer 500, unreacted portions of the silicon layer 500 can be removed prior to forming interlayer dielectric 600. In certain embodiments, a dry etching process such as, for example, reactive ion etching (RIE) can be used to strip the silicon. For instance, a suitable plasma process for etching silicon includes one or more halogen-containing gases, such as $NF_3$, $SF_6$ and $C_4F_8$. In other embodiments, a wet chemical etchant can be used. By way of example, strong alkaline substances (pH >12) such as aqueous potassium hydroxide (KOH), or tetramethyl ammonium hydroxide (TMAH) solutions can be used to selectively etch Si.

Referring to FIG. 6B, after forming the silicide capping layer 510 and removing the unreacted silicon layer 500, second dielectric layer 600 can be formed over the capping layer 510 and the dielectric layer 200. Contacts 700 can then be formed extending through the second dielectric layer 600 as discussed above. In various embodiments, contacts extending through second dielectric layer 600 can be in electrical contact with silicide capping layer 510.

The methods and structures of the present application provide a self-aligned silicide capping layer 510 over a cobalt contact 400. In certain embodiments, the capping layer is substantially co-planar with dielectric layer 200, and presents an etch-selective layer for forming electrical contact to the cobalt contact. Silicide capping layer 510 is an effective barrier to oxidation or migration of cobalt, such that the interface between the dielectric layer 200 and the dielectric layer 600 is substantially free of cobalt.

As used herein, the singular forms "a," "an" and "the" include plural referents unless the context clearly dictates otherwise. Thus, for example, reference to a "contact" includes examples having two or more such "contacts" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a contact that comprises cobalt include embodiments where a contact consists essentially of cobalt and embodiments where a contact consists of cobalt.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method for forming a semiconductor device, comprising:
    forming a via in a dielectric layer;
    forming a conductive contact within the via, wherein the conductive contact comprises cobalt;
    forming a silicon layer directly over the contact and over the dielectric layer, wherein the silicon layer comprises elemental silicon or silicon doped with up to 5 atomic percent of one or more dopants; and
    reacting the silicon layer over the contact to form a cobalt silicide capping layer directly over the contact.

2. The method of claim 1, wherein forming the conductive contact comprises forming a liner/barrier layer within the via.

3. The method of claim 1, wherein forming the conductive contact comprises filling the via with cobalt or a cobalt alloy, wherein the cobalt alloy comprises cobalt and up to 50 atomic percent of one or more element selected from the group consisting of B, C, N, Mg, Al, Si, P, Ti, V, Cr, Mn, Fe, Ni, Cu, Zn, Ge, Zr, Nb, Mo, Ru, Rh, Pd, Ag, Hf, Ta, W, Re, Ir, Pt and Au.

4. The method of claim 1, wherein the silicon layer is formed over the dielectric layer laterally adjacent to the via.

5. The method of claim 1, wherein the silicon layer is formed at a temperature of less than 275° C.

6. The method of claim 1, wherein the silicon layer thickness is 2 to 10 nm.

7. The method of claim 1, wherein reacting the silicon layer with the conductive contact comprises annealing silicon layer and the conductive contact at a temperature of 200° C. to 400° C.

8. The method of claim 1, further comprising nitriding the silicon layer over the dielectric layer.

9. The method of claim 1, further comprising removing the silicon layer from over the dielectric layer.

10. The method of claim 1, wherein a top surface of the cobalt silicide capping layer is co-planar with a top surface of the dielectric layer.

11. The method of claim 1, further comprising forming an interlayer dielectric over the cobalt silicide capping layer and over the dielectric layer.

12. The method of claim 11, wherein an interface between the interlayer dielectric and the dielectric layer is substantially free of cobalt.

13. The method of claim 1, wherein all of the silicon layer over the contact reacts to form the cobalt silicide.

14. A method for forming a semiconductor device, comprising:
    forming a via in a dielectric layer;
    forming a conductive contact within the via, wherein the conductive contact comprises elemental cobalt;
    forming a silicon layer directly over the contact and over the dielectric layer, wherein the silicon layer comprises elemental silicon or silicon doped with up to 5 atomic percent of one or more dopants; and
    reacting the silicon layer over the contact to form a cobalt silicide capping layer directly over the contact.

* * * * *